United States Patent
Takahara et al.

(10) Patent No.: US 11,787,630 B2
(45) Date of Patent: Oct. 17, 2023

(54) TRANSFER SYSTEM

(71) Applicant: DAIFUKU CO., LTD., Osaka (JP)

(72) Inventors: Fumio Takahara, Komaki (JP); Rina Ishii, Komaki (JP); Shinichiro Higashi, Komaki (JP)

(73) Assignee: DAIFUKU CO., LTD., Osaka (JP)

( * ) Notice: Subject to any disclaimer, the term of this patent is extended or adjusted under 35 U.S.C. 154(b) by 40 days.

(21) Appl. No.: 17/552,902

(22) Filed: Dec. 16, 2021

(65) Prior Publication Data
US 2022/0194701 A1 Jun. 23, 2022

(30) Foreign Application Priority Data

Dec. 18, 2020 (JP) ................................. 2020-209759

(51) Int. Cl.
*B65G 1/04* (2006.01)
*B65G 1/127* (2006.01)

(52) U.S. Cl.
CPC ........... *B65G 1/0457* (2013.01); *B65G 1/127* (2013.01); *B65G 2811/0621* (2013.01)

(58) Field of Classification Search
CPC ......... H01L 21/67754; H01L 21/67769; H01L 21/67736; H01L 21/67733; B65G 49/07; B65G 1/10; B65G 1/127; B65G 1/0457; B65G 2811/0621; A47B 51/00
USPC ............................................ 414/281, 331.01
See application file for complete search history.

(56) References Cited

U.S. PATENT DOCUMENTS

| 2,590,617 | A | * | 3/1952 | Henderson | .......... | E04F 21/1811 |
| | | | | | | 187/244 |
| 6,379,096 | B1 | * | 4/2002 | Beutler | ................ | B65G 1/0478 |
| | | | | | | 414/331.11 |
| 8,875,866 | B2 | * | 11/2014 | Sebe | ...................... | B65G 47/61 |
| | | | | | | 414/222.11 |
| 2001/0030109 | A1 | | 10/2001 | Nomura et al. | | |
| 2004/0191046 | A1 | * | 9/2004 | Mitsuyoshi | ....... | H01L 21/67769 |
| | | | | | | 414/754 |
| 2014/0003902 | A1 | * | 1/2014 | Inui | ...................... | B65G 1/0428 |
| | | | | | | 414/749.1 |
| 2015/0110585 | A1 | * | 4/2015 | Ota | ...................... | B65G 1/0457 |
| | | | | | | 414/222.13 |

(Continued)

FOREIGN PATENT DOCUMENTS

| JP | 2001-353627 A | 12/2001 |
| JP | 2004-238191 A | 8/2004 |
| JP | 2004-296996 A | 10/2004 |

(Continued)

OTHER PUBLICATIONS

Notice of Reasons for Refusal dated Feb. 14, 2023 in related/corresponding Japanese Patent Application No. 2020-209759.

*Primary Examiner* — Glenn F Myers
(74) *Attorney, Agent, or Firm* — KUSNER & JAFFE

(57) ABSTRACT

A transfer system includes a carrier and a storage shelf. The carrier transfers an object along a transfer path on or suspended from a ceiling. The storage shelf is disposed along the transfer path and stores the object transferred by the carrier. The storage shelf includes a placement portion having the object placed thereon. The placement portion moves up and down with respect to a transfer position Tat which the object is transferred between the placement portion and the carrier.

2 Claims, 7 Drawing Sheets

(56) References Cited

U.S. PATENT DOCUMENTS

2015/0303089 A1\* 10/2015 Doherty ............ H01L 21/67769
414/222.07

FOREIGN PATENT DOCUMENTS

| | | | |
|---|---|---|---|
| JP | 2005-530361 | A | 10/2005 |
| JP | 2009-062153 | A | 3/2009 |
| JP | 2010-064833 | A | 3/2010 |
| JP | 2013-129501 | A | 7/2013 |
| JP | 2020-066499 | A | 4/2020 |
| KR | 10-2021-0012121 | A | 2/2021 |
| WO | WO2004/001582 | A1 | 12/2003 |

\* cited by examiner

TRANSFER SYSTEM

FIELD OF THE INVENTION

The present invention relates to a transfer system including a carrier configured to transfer an object along a transfer path on or suspended from a ceiling, and a storage shelf disposed along the transfer path and configured to store the object transferred by the carrier.

BACKGROUND OF THE INVENTION

A conventional transfer system including a carrier and a suspended shelf is described in Japanese Patent Laid-Open No. 2020-66499. The carrier runs along a rail provided near a ceiling of the building and transfers an object. The suspended shelf temporarily stores the object suspended from the ceiling and transferred by the carrier.

The transfer system in Japanese Patent Laid-Open No. 2020-66499 includes a fixed shelf and a movable shelf, both provided on the suspended shelf. Laterally sliding the movable shelf allows the object to be transferred between the carrier and the movable shelf.

However, the transfer system in Japanese Patent Laid-Open No. 2020-66499 requires a certain amount of space for disposing the fixed shelf and movable shelf of the suspended shelf below the ceiling. This is because the fixed shelf and movable shelf of the suspended shelf are disposed to predetermined positions below the ceiling. Disposing a plurality of the fixed shelves or movable shelves of the suspended shelf in a vertical direction particularly requires a large amount of space in the vertical direction. Thus, disposing the suspended shelf is limited to a certain location.

Alternatively, a transfer position of the object for the carrier may be fixed (i.e., the carrier does not move the objects up and down at the time of transfer). In such a case, the fixed shelf and movable shelf of the suspended shelf need to be disposed according to the transfer position of the object on the carrier. Therefore, the location for disposing the suspended shelf is limited. Additionally, a size of the suspended shelf increases in the vertical direction.

Unfortunately, the suspended shelf cannot be disposed in the location with limited space for disposing the suspended shelf.

In order to solve the problem, an object of the present invention is to provide a transfer system capable of disposing a storage shelf suspended from the ceiling even in a location with limited space for disposing the storage shelf.

DISCLOSURE OF THE INVENTION

The object of the present invention is as described above, and a solution to this object will be described below.

A transfer system according the present invention includes a carrier configured to transfer an object along a transfer path on or suspended from a ceiling, and a storage shelf disposed along the transfer path and configured to store the object transferred by the carrier. The storage shelf includes a placement portion having the object placed thereon. The placement portion moves up and down with respect to a transfer position at which the object is transferred between the placement portion and the carrier.

In this configuration, the placement portion of the storage shelf can move up and down with respect to the transfer position of the object on the carrier.

In the transfer system of the present invention, the storage shelf can include a plurality of the placement portions disposed in a vertical direction, the placement portions capable of having a plurality of the objects placed thereon. Each of the placement portions moves up and down with respect to the transfer position at which the object is transferred between the placement portion and the carrier.

In this configuration, a plurality of the placement portions of the storage shelf can move up and down with respect to the transfer position of the object on the carrier.

In the transfer system of the present invention, the storage shelf can include a holder configured to hold the placement portion. The holder extends or contracts in the vertical direction.

In this configuration, the placement portion of the storage shelf can move up and down by extending or contracting of the holder in the vertical direction.

In the transfer system of the present invention, the placement portion can move up and down in response to driving a pneumatic cylinder or a ball screw.

In this configuration, the placement portion of the storage shelf can move up and down in response to driving the pneumatic cylinder or the ball screw.

In the transfer system of the present invention, the placement portion can move down under own weight of the placement portion.

In this configuration, the placement portion of the storage shelf can move down under the own weight of the placement portion without being driven by the driving source.

The transfer system according the present invention can include a lower carrier configured to transfer the object along a lower transfer path provided below the transfer path. The placement portion moves up and down between the transfer position at which the object is transferred between the placement portion and the carrier, and a transfer position at which the object is transferred between the placement portion and the lower carrier.

In this configuration, the placement portion of the storage shelf can transfer the object between the carrier placed closer to the ceiling and the lower carrier placed below the carrier.

In the transfer system of the present invention, the storage shelf can include an elevator configured to move up and down the placement portion, and a drive power transmission configured to transmit driving force to the elevator. The drive power transmission transmits driving power supplied from the carrier to the elevator.

In this configuration, the placement portion of the storage shelf can move up and down by the driving force supplied from the carrier.

In the transfer system of the present invention, the placement portion can move up and down with respect to the transfer position of the object on the carrier. This eliminates the need for disposing the placement portion according to the transfer position of the object on the carrier. Thus, a certain amount of space is not required for disposing the placement portion. Additionally, the storage shelf can be downsized.

DETAILED DESCRIPTION OF INVENTION

A transfer system 10 for transferring an object according to the present invention will be described below.

Figure 1A:
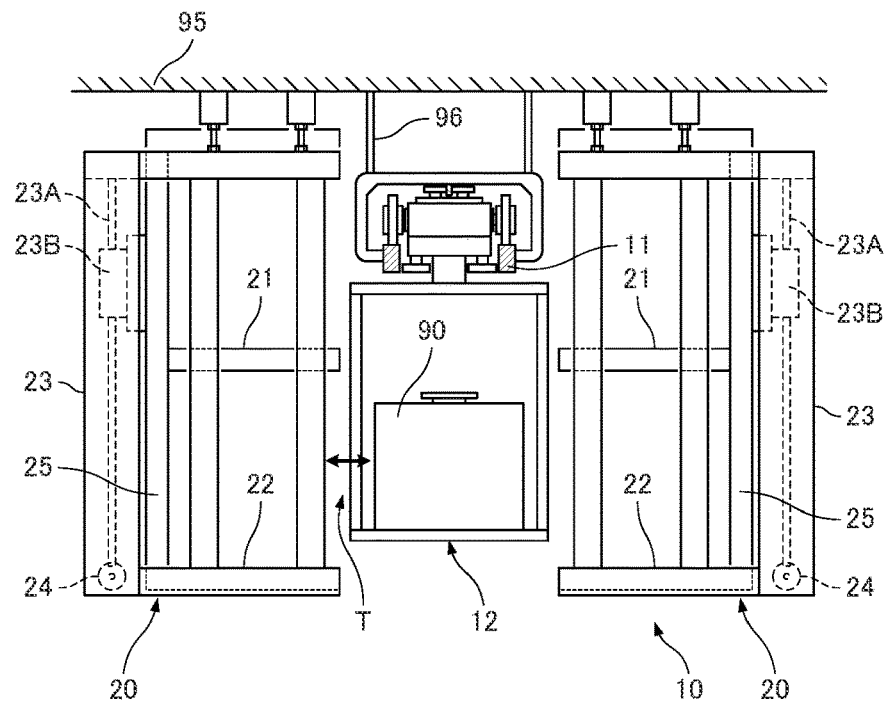
FIG. 1A is a front view of a transfer system according to an embodiment of the present invention.
Figure 1B:
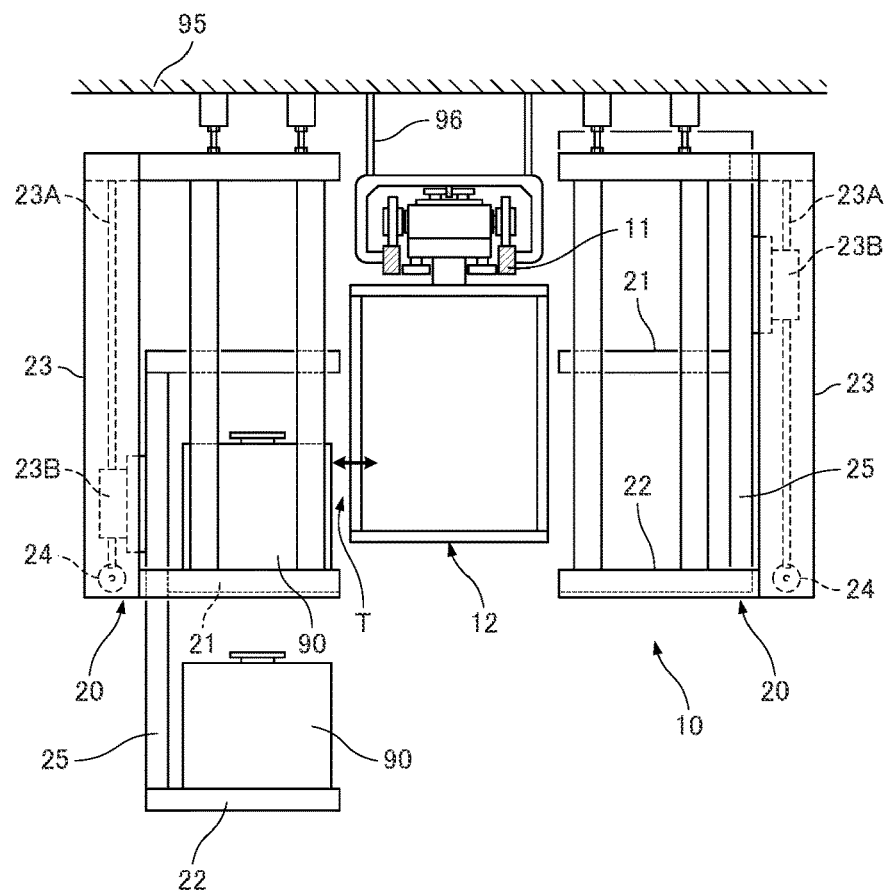
FIG. 1B is a front view of the transfer system that causes a placement portion to move down.

The transfer system 10 is installed, for example, in a clean room of a semiconductor manufacturing plant. The transfer system 10 transfers a foup 90 (an example of "object") between a plurality of processors processing semiconductor substrates. The foup 90 houses the semiconductor substrates. As illustrated in FIGS. 1A and 1B, the transfer system 10 includes a rail 11, a carrier 12, and a storage shelf 20. The rail 11 is a transfer path for running of the carrier 12. The carrier 12 runs along the rail 11 near a ceiling 95. The storage shelves 20 are disposed along the rail 11 near the ceiling 95.

The rail 11 is disposed above the plurality of processors (not shown) near the ceiling 95. The rail 11 is supported, for example, by hanger rods 96 from the ceiling 95.

The carrier 12 transfers the foup 90 housing the semiconductor substrates along the rail 11. The carrier 12 is attached to and suspended from the rail 11. The carrier 12 runs along the rail 11. Such carrier 12 stops in front of the storage shelf 20 on which the foup 90 is to be placed (a position where the foup 90 is transferred, hereinafter referred to as a transfer position T). The foup 90 is then transferred to the storage shelf 20.

Each of the storage shelves 20 temporarily stores the foup 90 transferred by the carrier 12. The foup 90 is transferred between the storage shelf 20 and the carrier 12 at the transfer position T for the foup 90. The transfer system 10 includes a plurality of the storage shelves 20 aligned along the rail 11. As illustrated in FIGS. 1A and 1B, the storage shelves 20 are disposed on right and left sides of the rail 11. The storage shelves 20 thus face each other with the rail 11 sandwiching therebetween. Alternatively, the storage shelves 20 are disposed either one of the right and left sides of the rail 11. The storage shelves 20 are suspended from the ceiling 95 and held, for example, by hanger rods 96. As described above, the transfer system 10 includes a plurality of the storage shelves 20. However, the transfer system 10 may include one storage shelf 20.

As illustrated in FIGS. 1A and 1B, each of the storage shelves 20 includes a plurality of placement portions 21 and 22, an LM (Linear Motion) guide actuator 23 (an example of "elevator" and "drive power transmission"), and a motor 24. The placement portions 21 and 22 are used for placing the foup 90 thereon. The LM guide actuator 23 moves up and down the placement portions 21 and 22. The motor 24 drives the LM guide actuator 23.

The upper placement portion 21 and lower placement portion 22 are plates, allowing the foup 90 to be placed thereon. The upper placement portion 21 and lower placement portion 22 are disposed at predetermined intervals in the vertical direction. This allows each of the two foups 90 vertically arranged to be placed on the corresponding upper placement portion 21 or lower placement portion 22. The upper placement portion 21 and lower placement portion 22 are connected by a frame 25 that extends in the vertical direction.

The storage shelf 20 causes the upper placement portion 21 or lower placement portion 22 to move to a position at which the carrier 12 stops, that is, the transfer position T for the foup 90. Consequently, the foup 90 is transferred between the storage shelf 20 and the carrier 12. The LM guide actuator 23 in the storage shelf 20 therefore causes the upper placement portion 21 and lower placement portion 22 to move up and down with respect to the transfer position T (position at which the foup 90 is transferred between the storage shelf 20 and the carrier 12).

The LM guide actuator 23 extends in the vertical direction near one end of the upper placement portion 21 and one end of the lower placement portion 22. The LM guide actuator 23 includes a ball screw shaft 23A, and a block 23B. Rotating the ball screw shaft 23A causes the block 23B to move. The ball screw shaft 23A extends in the vertical direction. The motor 24 is disposed at a lower end of the ball screw shaft 23A. Driving the motor 24 rotates the ball screw shaft 23A. Such rotation of the ball screw shaft 23A causes the block 23B to move up and down on the ball screw shaft 23A. The block 23B is connected to the frame 25 holding the upper placement portion 21 and lower placement portion 22. Moving up and down the block 23B of the LM guide actuator 23 causes the frame 25 to move up and down. Such movement of the frame 25 causes the upper placement portion 21 and lower placement portion 22 to move up and down accordingly.

Alternatively, a pneumatic cylinder substituted for the LM guide actuator 23 may move up and down the upper placement portion 21 and lower placement portion 22 in the storage shelf 20. In such a case, a piston rod of the pneumatic cylinder (not shown) is connected to the frame 25. Extension and retraction of the piston rod moves up and down the frame 25. Such movement of the frame 25 causes the upper placement portion 21 and lower placement portion 22 to move up and down accordingly.

The LM guide actuator 23 or the pneumatic cylinder moves up and down the upper placement portion 21 and lower placement portion 22. In such a case, the upper placement portion 21 or the lower placement portion 22 may be moved to the transfer position T before the carrier 12 arrives at the transfer position T. The foup 90 can be transferred effectively between the carrier 12 and the storage shelf 20 by moving the upper placement portion 21 or the lower placement portion 22 to the transfer position T before the carrier 12 arrives at the transfer position T.

Here, the LM guide actuator 23 or the pneumatic cylinder (not shown) can move down the upper placement portion 21 and lower placement portion 22 in the storage shelf 20.

However, the upper placement portion 21 and lower placement portion 22 may move down under own weight of the upper placement portion 21 and lower placement portion 22 without using the LM guide actuator 23 or the pneumatic cylinder. In such a case, the LM guide actuator 23 or the pneumatic cylinder moves up the upper placement portion 21 and lower placement portion 22. The upper placement portion 21 and lower placement portion 22 moves down as follows. First, stopping the motor 24 causes the block 23B of the LM guide actuator 23 to go into a free state. Alternatively, stopping the air supply to the pneumatic cylinder causes the piston rod of the pneumatic cylinder to go into a free state. The upper placement portion 21 and lower placement portion 22 then move down under the own weight of the upper placement portion 21 and lower placement portion 22.

Figure 2A:
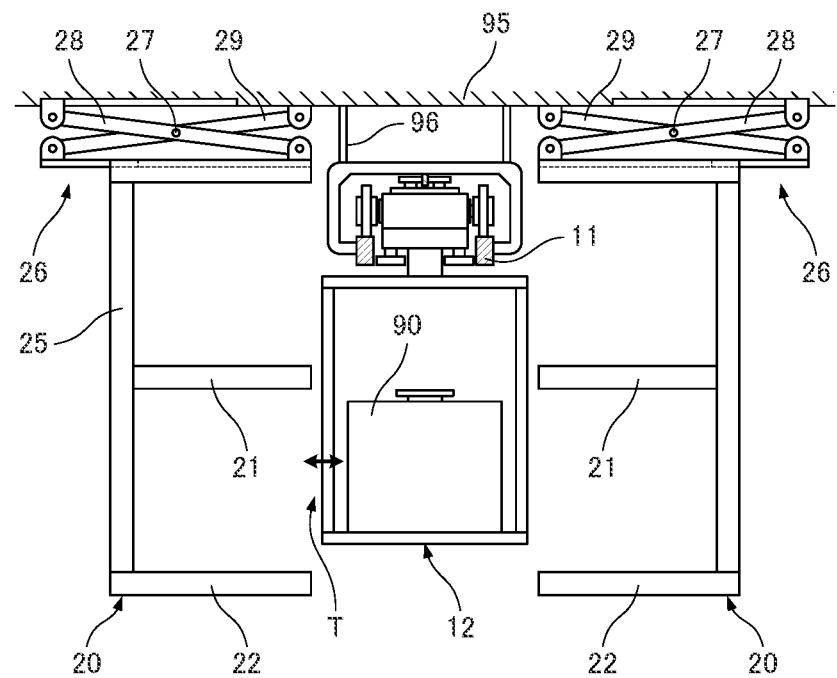
FIG. 2A is a front view of the transfer system according to the embodiment of the present invention, where a holder that holds the placement portion is a pantograph mechanism.
Figure 2B:
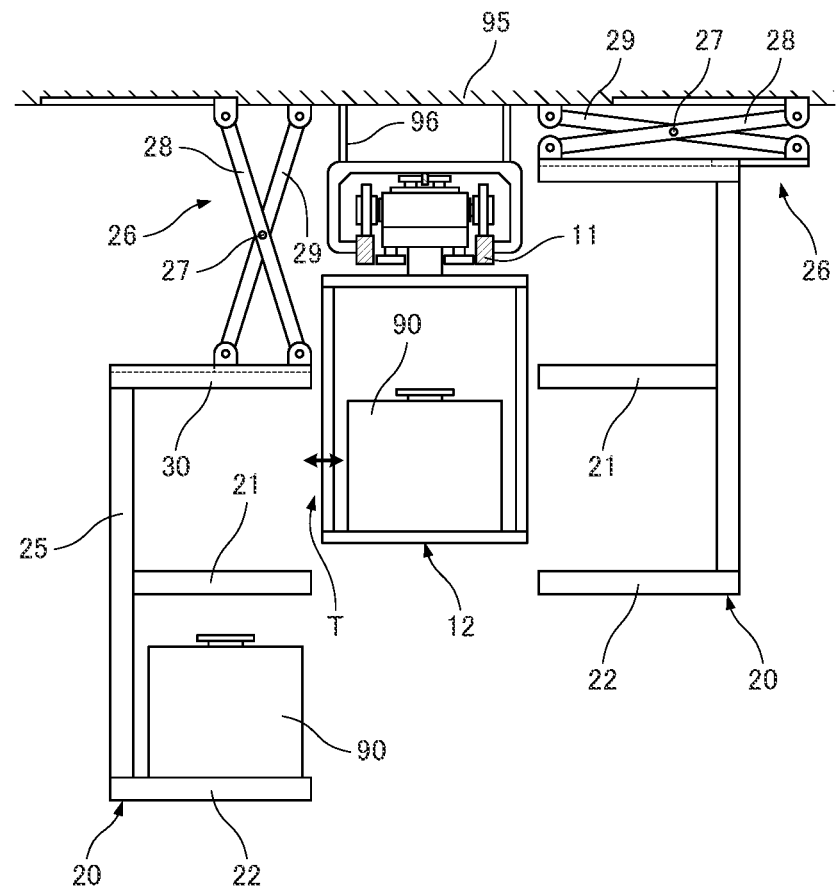
FIG. 2B is a front view of the transfer system that causes the placement portion to move down.

As illustrated in FIGS. 2A and 2B, the storage shelf 20 may include a holder 26 that holds the upper placement portion 21 and lower placement portion 22. The holder 26 may be a vertically extendable pantograph mechanism that causes the upper placement portion 21 and lower placement portion 22 to move up and down. The holder 26 includes two links 28 and 29 with both central intersections pivotally connected each other by using a central fulcrum shaft 27 and concentric with each other. The two links 28 and 29 are disposed movably in the vertical direction between the ceiling 95 and an upper part of the frame 25. Extending the two links 28 and 29 downward causes the upper placement portion 21 and lower placement portion 22 held by the holder 26 to move down. Contracting the two links 28 and 29 upward causes the upper placement portion 21 and lower placement portion 22 to move up.

Figure 3A:
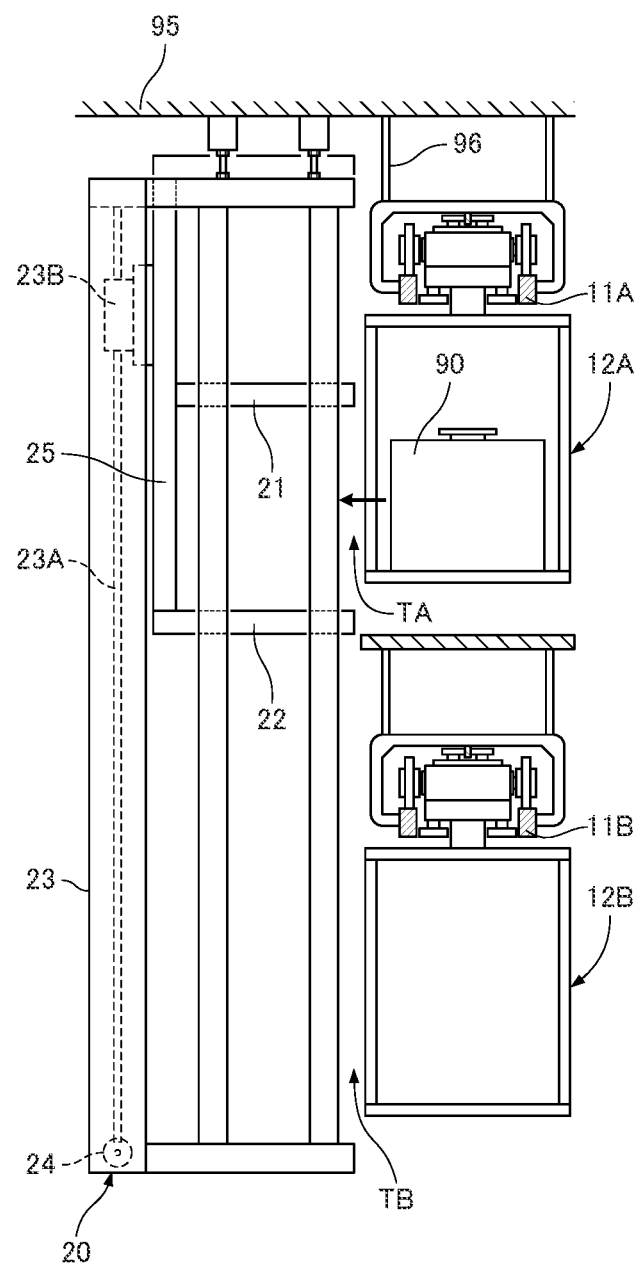
FIG. 3A is a front view of the transfer system according to the embodiment of the present invention, where transfer paths for the carrier are arranged in the vertical direction in parallel with each other.
Figure 3B:
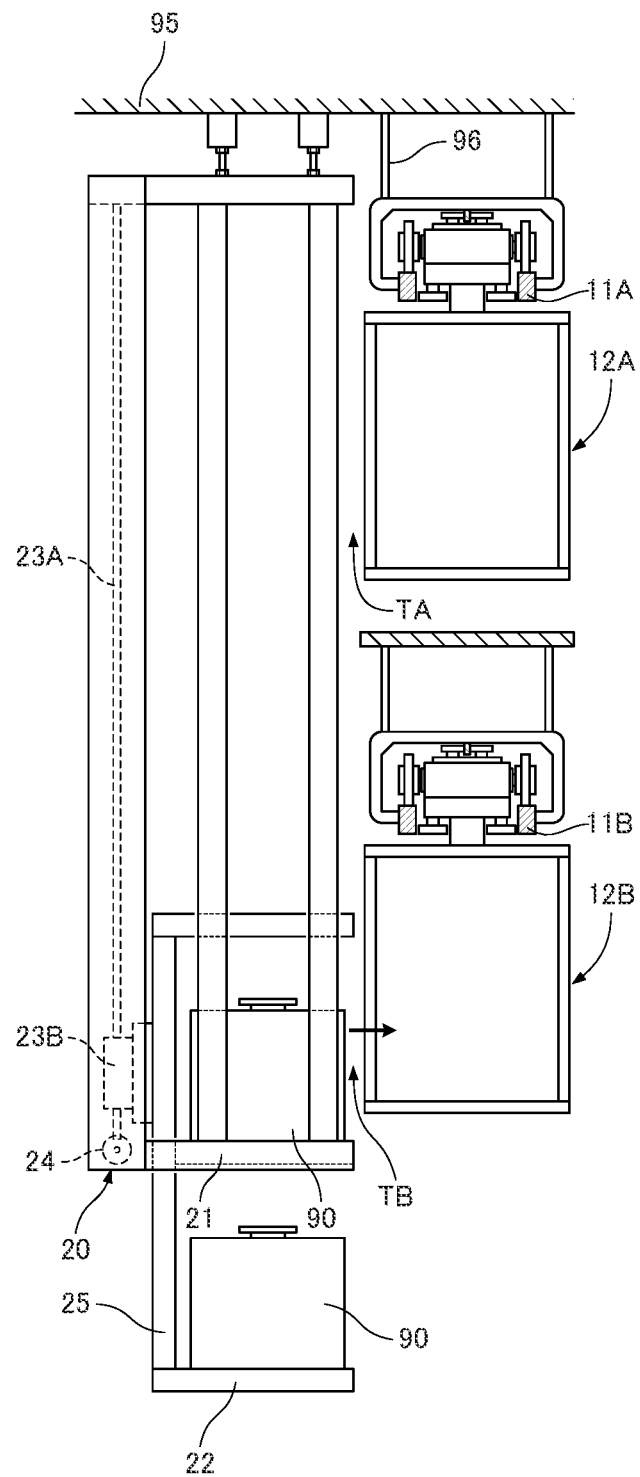
FIG. 3B is a front view of the transfer system that causes the placement portion to move down.

As illustrated in FIGS. 3A and 3B, the transfer system 10 may include transfer paths arranged in the vertical direction in parallel with each other. Alternatively, the carriers 12 may be arranged in the vertical direction and run. In such cases, the upper placement portion 21 and lower placement portion 22 of the storage shelf 20 move up and down with respect to a transfer position TA for the foup 90 and a transfer position TB for the foup 90. The transfer position TA is for an upper carrier 12A running along an upper rail 11A of the upper transfer path. The transfer position TB is for a lower carrier 12B running along a lower rail 11B of the lower transfer path.

More specifically, as illustrated in FIG. 3A, the upper placement portion 21 and lower placement portion 22 receive the foup 90 from the upper carrier 12A at the transfer position TA of the upper carrier 12A. As illustrated in FIG. 3B, the LM guide actuator 23 then causes the upper placement portion 21 and lower placement portion 22 to move down to the transfer position TB of the lower carrier 12B. The upper placement portion 21 and lower placement portion 22 pass the foup 90 to the lower carrier 12B. Subsequently, as illustrated in FIG. 3A, the LM guide actuator 23 causes the upper placement portion 21 and lower placement portion 22 to move up to the transfer position TA of the upper carrier 12A. The upper placement portion 21 and lower placement portion 22 then receive the foup 90 from another upper carrier 12A. Such upper placement portion 21 and lower placement portion 22 receive the foup 90 at the transfer position TA of the upper carrier 12A. On the other hand, the upper placement portion 21 and lower placement portion 22 pass the foup 90 at the transfer position TB of the lower carrier 12B.

Alternatively, the upper placement portion 21 and lower placement portion 22 may pass the foup 90 to the upper carrier 12A at the transfer position TA of the upper carrier 12A. The upper placement portion 21 and lower placement portion 22 may receive the foup 90 from the lower carrier 12B at the transfer position TB of the lower carrier 12B.

Figure 4A:
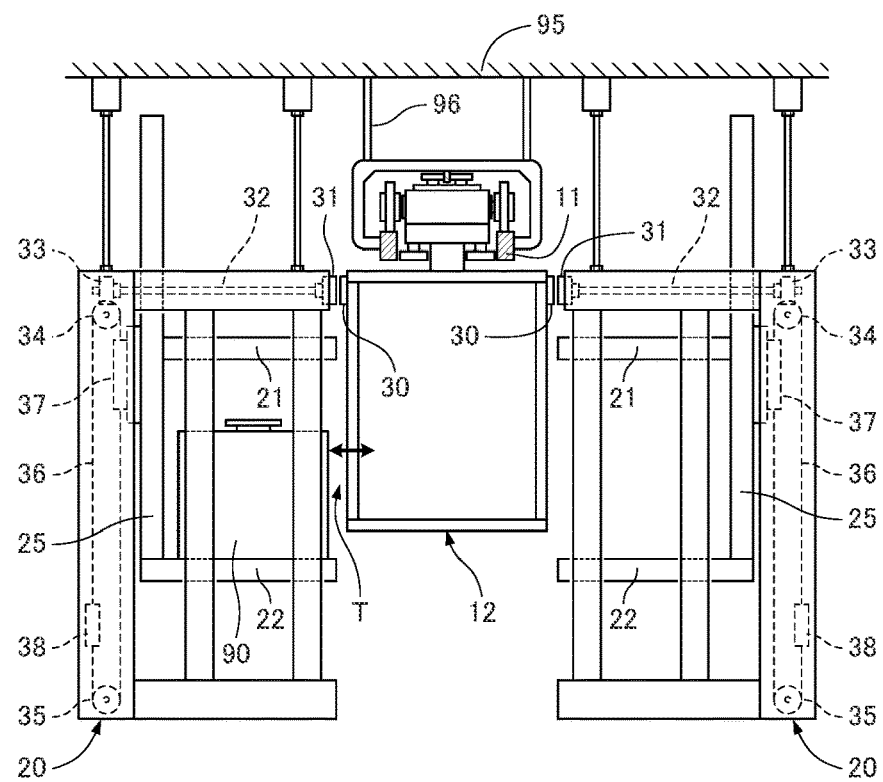
FIG. 4A is a front view of the transfer system according to the embodiment of the present invention, where the carrier includes a driving source for moving up and down the placement portion.
Figure 4B:
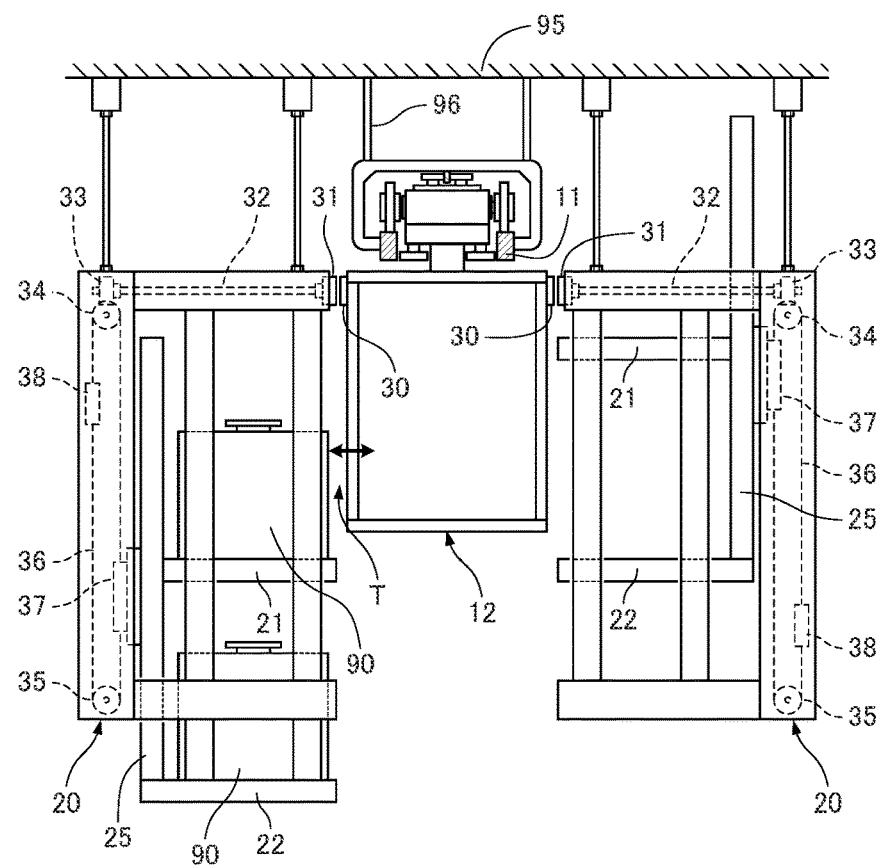
FIG. 4B is a front view of the transfer system that causes the placement portion to move down.

The transfer system 10 causes the upper placement portion 21 and lower placement portion 22 to move up and down by the driving power of the motor 24 on the storage shelf 20. However, as illustrated in FIGS. 4A and 4B, the upper placement portion 21 and lower placement portion 22 may be moved up and down by driving power of a motor provided on the carrier 12 (not shown). That is, the carrier 12 may include a driving source for moving up and down the upper placement portion 21 and lower placement portion 22. Such driving source on the carrier 12 for moving up and down the upper placement portion 21 and lower placement portion 22 enables maintenance of the storage shelf 20 easier than that of the driving source provided on the storage shelf 20. Maintenance work for the driving source is not preferable in the clean room of semiconductor manufacturing plant in view of generating particles. Providing the driving source on the carrier 12 can avoid the maintenance work for the driving source in the clean room.

As illustrated in FIGS. 4A and 4B, the carrier 12 includes a pair of driving magnetic gears 30, and a motor (not shown). The motor, that is, a driving source causes the driving magnetic gears 30 to rotary drive.

The storage shelf 20 includes a driven magnetic gear 31, a transmission shaft 32 for the driving power, a worm gear 33, a driving pulley 34, a driven pulley 35, a timing belt 36, a bracket 37, and a counterweight 38. The transmission shaft 32 is connected to the driven magnetic gear 31. The worm gear 33 is connected to the transmission shaft 32. The worm gear 33 drives the driving pulley 34. The driven pulley 35 corresponds to the driving pulley 34. The timing belt 36 is bridged over the driving pulley 34 and the driven pulley 35. The timing belt 36 includes the bracket 37 connected to the frame 25, and the counterweight 38. Here, FIGS. 4A and 4B illustrate the transfer system 10 including the storage shelves 20 disposed at both sides of the rail 11. However, in the case of the transfer system 10 with the storage shelves 20 disposed at one side of the rail 11, the carrier 12 may include one driving magnetic gear 30.

To move up and down the upper placement portion 21 and lower placement portion 22, the driving source may be provided on the carrier 12. In such a case, stopping the carrier 12 at the transfer position T causes one of the driving magnetic gears 30 on the carrier 12 to face the driven magnetic gear 31 on the storage shelf 20. That is, the driving magnetic gear 30 is placed at the position where the driving force of the motor 24 can be transmitted to the driven magnetic gear 31 by a magnetic field in a non-contact manner. Attraction and repulsion of the driving magnetic gear 30 and driven magnetic gear 31 transmits the rotational driving force of the driving magnetic gear 30 to the driven magnetic gear 31. The driving force transmitted to the driven magnetic gear 31 is then transmitted to the worm gear 33 via the transmission shaft 32, and further to the driving pulley 34. Transmitting the driving force to the driving pulley 34 causes the bracket 37 of the timing belt 36 to move down. The upper placement portion 21 and lower placement portion 22 held by the frame 25 move down accordingly.

On the other hand, transmitting the driving force of the motor stops in response to the carrier 12 moving away from the transfer position T. The bracket 37 of the timing belt 36 then moves up under own weight of the counterweight 38. The upper placement portion 21 and lower placement portion 22 held by the frame 25 move up accordingly.

Figure 5A:
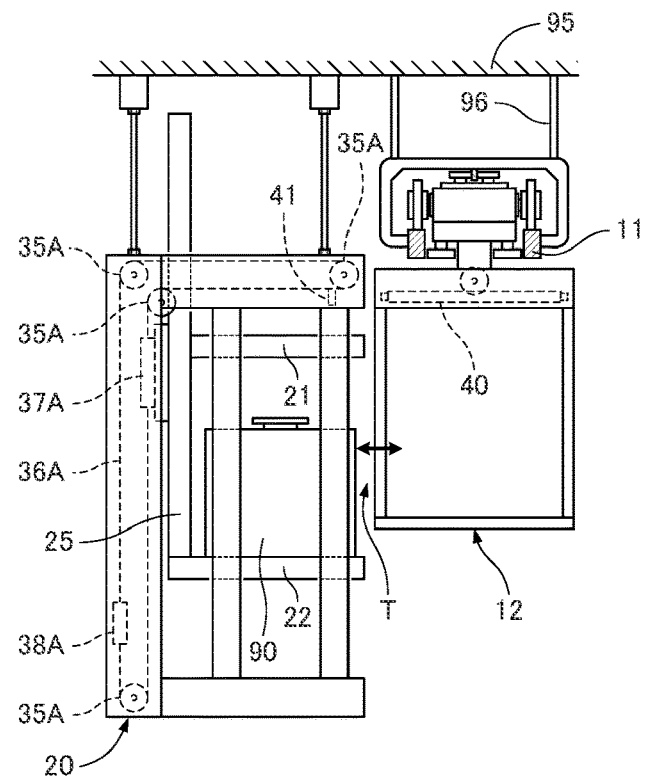
FIG. 5A is a front view of the transfer system according to the embodiment of the present invention, where the carrier includes a driving source for moving up and down the placement portion.
Figure 5B:
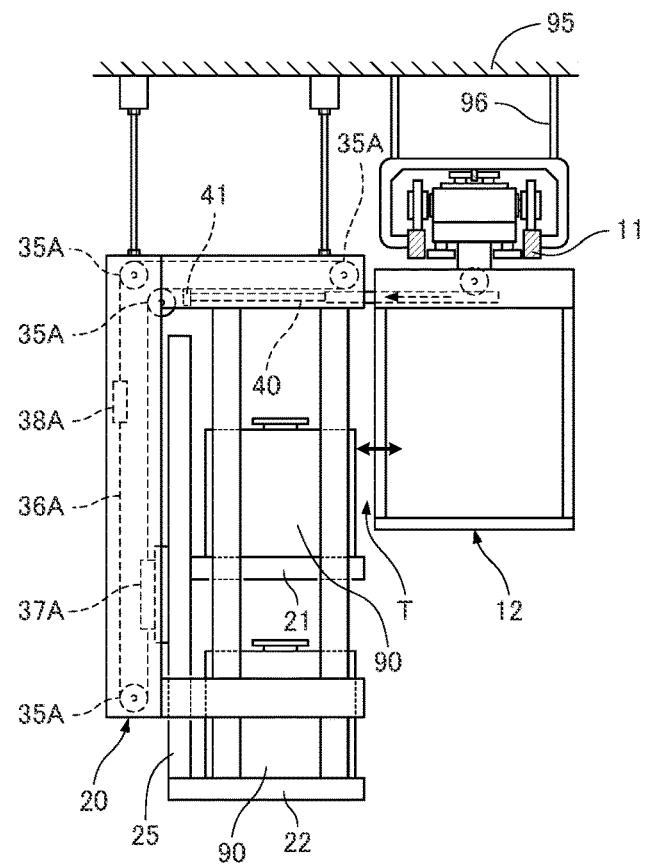
FIG. 5B is a front view of the transfer system that causes the placement portion to move down.

As illustrated in FIGS. 5A and 5B, the carrier 12 in the transfer system 10 may include the driving source and a drive power transmission. The driving source moves up and down the upper placement portion 21 and lower placement portion 22. The drive power transmission transmits the driving power of the driving source. As illustrated in FIGS. 5A and 5B, the carrier 12 includes a motor (not shown) and a protrusion 40. The motor, that is, the driving source causes the upper placement portion 21 and lower placement portion 22 to move up and down. The protrusion 40 is the drive power transmission for transmitting the driving power of the motor. The protrusion 40 of a rod shape protrudes and moves in the horizontal direction in response to driving the motor.

The storage shelf 20 includes a plurality of driven pulleys 35A, a timing belt 36A bridged over the driven pulleys 35, a counterweight 38A, a receiver 41, and a bracket 37A. The driven pulleys 35A and the timing belt 36A move up and down the upper placement portion 21 and lower placement portion 22. The timing belt 36A includes the counterweight 38A, and the receiver 41 that receives the protrusion 40 of the carrier 12. The timing belt 36A also includes the bracket 37A connected to the frame 25.

As described above, the carrier 12 includes the driving source for moving up and down the upper placement portion 21 and lower placement portion 22. In such a case, stopping the carrier 12 at the transfer position T causes a tip of the protrusion 40 of the carrier 12 to face the receiver 41 of the storage shelf 20. That is, the protrusion 40 is placed at a position where the tip thereof can push the receiver 41 at the time of protruding and moving in the horizontal direction in response to driving the motor. The protrusion 40 then protrudes and moves in the horizontal direction in response to driving the motor. Consequently, the receiver 41 is pushed by receiving the protrusion 40. Pushing the receiver 41 with the protrusion 40 causes the timing belt 36A connected to the receiver 41 to move. The bracket 37A of the timing belt 36A moves down accordingly. This causes the frame 25 connected to the bracket 37A to move down. Thus, the upper placement portion 21 and lower placement portion 22 held by the frame 25 move down.

On the other hand, transmitting the driving force of the motor stops in response to the carrier 12 moving away from the transfer position T. In such a case, the bracket 37A of the timing belt 36A moves up under own weight of the counterweight 38A. Moving up the bracket 37A causes the frame 25 connected to the bracket 37A to move up, as well as the upper placement portion 21 and lower placement portion 22 held by the frame 25 to move up.

Figure 6A:
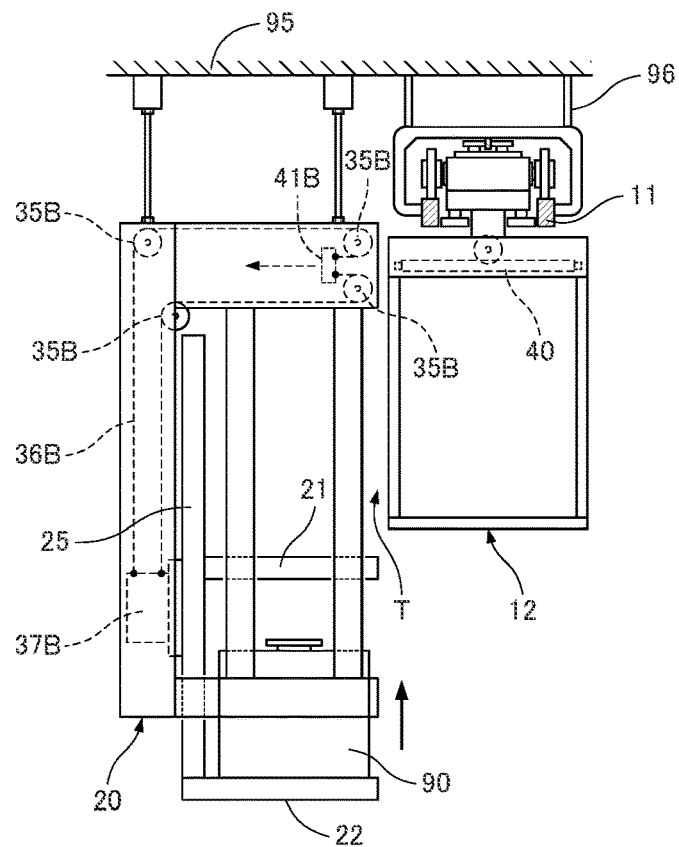
FIG. 6A is a front view of the transfer system according to the embodiment of the present invention, where the carrier includes the driving source for moving up and down the placement portion.
Figure 6B:
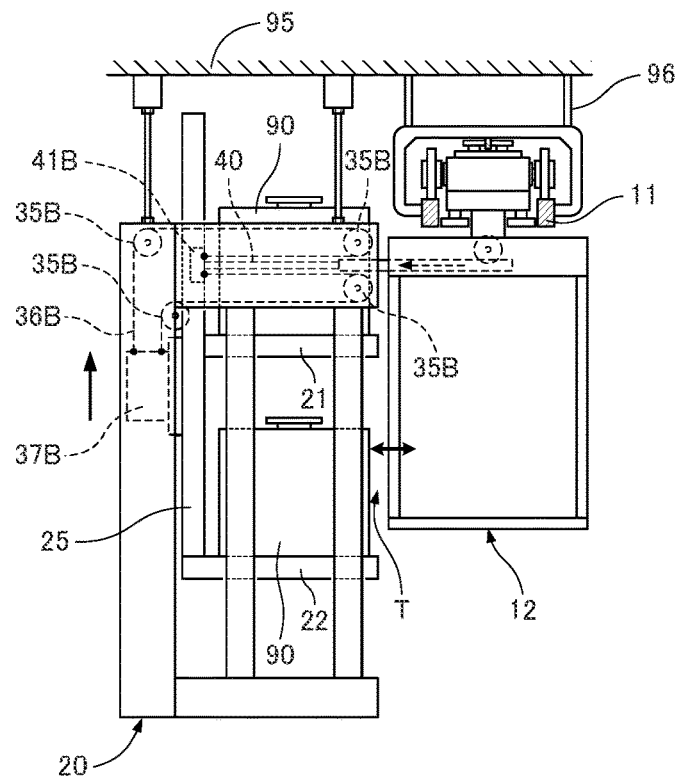
FIG. 6B is a front view of the transfer system that causes the placement portion to move up.

As illustrated in FIGS. 6A and 6B, the carrier 12 in the transfer system 10 may include the driving source and the drive power transmission. The driving source moves up and down the upper placement portion 21 and lower placement portion 22. The drive power transmission transmits the driving power of the driving source. As illustrated in FIGS. 6A and 6B, the carrier 12 includes the motor (not shown) and the protrusion 40. The motor, that is, the driving source causes the upper placement portion 21 and lower placement portion 22 to move up and down. The protrusion 40 is the drive power transmission for transmitting the driving power of the motor. The protrusion 40 of a rod shape protrudes and moves in the horizontal direction in response to driving the motor.

The storage shelf 20 includes a plurality of driven pulleys 35B, a timing belt 36B bridged over the driven pulleys 35B, a receiver 41B, and a bracket 37B. The driven pulleys 35B and the timing belt 36B move up and down the upper placement portion 21 and lower placement portion 22. The timing belt 36B includes the receiver 41B that receives the protrusion 40 of the carrier 12, and the bracket 37B connected to the frame 25. The receiver 41B is provided on one end of the timing belt 36B, while the bracket 37B is provided on the other end of the timing belt 36B.

As described above, the carrier 12 includes the driving source for moving up and down the upper placement portion 21 and lower placement portion 22. In such a case, stopping the carrier 12 at the transfer position T causes a tip of the protrusion 40 of the carrier 12 to face the receiver 41B of the storage shelf 20. The protrusion 40 then protrudes and moves in the horizontal direction in response to driving the motor. Consequently, the receiver 41B is pushed by receiving the protrusion 40. Pushing the receiver 41B with the protrusion 40 causes the receiver 41B to pull the one end of the timing belt 36B in the horizontal direction. This causes the other end of the timing belt 36B to be pulled upward. The bracket 37B moves up accordingly. Thus, the upper placement portion 21 and lower placement portion 22 held by the frame 25 move up.

On the other hand, transmitting the driving force of the motor stops in response to the carrier 12 moving away from the transfer position T. In such a case, the upper placement portion 21 and lower placement portion 22 move down under the own weight of the upper placement portion 21 and lower placement portion 22. At this time, the bracket 37B connected to the frame 25 moves down, while pulling down the other end of the timing belt 36B. The receiver 41B gets caught by the driven pulleys 35B provided on the one end of the timing belt 36B, and stops moving. This causes the upper placement portion 21 and lower placement portion 22 to stop moving down.

The above transfer system 10 enables the upper placement portion 21 and lower placement portion 22 to move up and down with respect to the transfer position T of the carrier 12. Thus, the upper placement portion 21 and lower placement portion 22 do not need to be disposed according to the transfer position of the carrier 12. A certain amount of space is not required for disposing the upper placement portion 21 and lower placement portion 22. Additionally, the storage shelf can be downsized.

In the embodiment, the storage shelf 20 includes two placement portions disposed in the vertical direction (the upper placement portion 21 and lower placement portion 22), but not limited thereto. The storage shelf 20 may include three or more placement portions disposed in the vertical direction, or may include one placement portion.

In the embodiment, the foup 90 is the object to be transferred by the carrier 12, but not limited thereto. Any object can be transferred as long as the carrier 12 can transfer the object and the storage shelf 20 can store the object.

In the embodiment, the single upper placement portion 21 and single lower placement portion 22 of the storage shelf 20 are disposed in a longitudinal direction of the rail 11, but not limited thereto. The storage shelf 20 may include a plurality of the upper placement portions 21 and lower placement portions 22 aligned along the longitudinal direction of the rail 11 (for example, the storage shelf 20 may include two vertical rows and three horizontal rows of the placement portions by disposing the three upper placement portions 21 and lower placement portions 22 along the longitudinal direction (side by side) of the rail 11).

In the embodiment, the protrusion 40 can protrude against the receiver 41 or the receiver 41B of the storage shelf 20 that is provided on one side of the rail 11, but not limited thereto. The protrusion 40 may protrude against the receivers 41 or receivers 41B of the storage shelves 20 provided on both sides of the rail 11.

In the embodiment, the two placement portions arranged in the vertical direction of the storage shelf 20 (the upper placement portions 21 and lower placement portions 22) move up and down, but not limited thereto. The lower placement portion 22 of the storage shelf 20 may be fixed (incapable of moving up and down), allowing only the upper placement portion 21 to move up and down. Alternatively, the upper placement portion 21 may be fixed (incapable of moving up and down), allowing only the lower placement portion 22 to move up and down.

REFERENCE SIGNS LIST

10 transfer system
12 carrier
20 storage shelf
21 upper placement portion (placement portion)
22 lower placement portion (placement portion)
90 foup
95 ceiling

What is claimed is:

1. A transfer system, comprising:
    an upper transfer path on or suspended from a ceiling;
    a lower transfer path arranged below the upper transfer path in parallel with the upper transfer path;
    a first carrier configured to transfer a first object along the upper transfer path;
    a second carrier configured to transfer a second object along the lower transfer path;
    a storage shelf disposed along the upper and lower transfer path and configured to store the first and second objects transferred by the first and second carriers; and
    a placement portion included in the storage shelf and having the first and second objects placed thereon, the placement portion being configured to move up and down with respect to first and second transfer positions at which the first and second objects are transferred between the placement portion and the first and second carriers.

2. A transfer system, comprising:
    a transfer path on or suspended from a ceiling;
    a carrier configured to transfer an object along the transfer path;
    a storage shelf disposed along the transfer path and configured to store the object transferred by the carrier; and
    a placement portion included in the storage shelf and having the object placed thereon, the placement portion being configured to move up and down with respect to a transfer position at which the object is transferred between the placement portion and the carrier,
    wherein the storage shelf comprises:
        an elevator configured to move the placement portion up and down; and
        a drive power transmission configured to transmit driving force to the elevator, and
    wherein the carrier comprises a driving source configured to transmit drive power to the drive power transmission.

* * * * *